(12) United States Patent
Li

(10) Patent No.: US 11,981,997 B2
(45) Date of Patent: May 14, 2024

(54) FILM DEPOSITION METHOD AND FILM DEPOSITION APPARATUS

(71) Applicant: CHANGXIN MEMORY TECHNOLOGIES, INC., Hefei (CN)

(72) Inventor: Feng Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 123 days.

(21) Appl. No.: 17/442,338

(22) PCT Filed: Jun. 30, 2021

(86) PCT No.: PCT/CN2021/103642
§ 371 (c)(1),
(2) Date: Sep. 23, 2021

(87) PCT Pub. No.: WO2022/160595
PCT Pub. Date: Aug. 4, 2022

(65) Prior Publication Data
US 2023/0054843 A1    Feb. 23, 2023

(30) Foreign Application Priority Data
Jan. 27, 2021    (CN) .......................... 202110107889.3

(51) Int. Cl.
*C23C 16/46*    (2006.01)
*C23C 16/40*    (2006.01)
(Continued)

(52) U.S. Cl.
CPC ............ *C23C 16/46* (2013.01); *C23C 16/402* (2013.01); *C23C 16/4583* (2013.01); *C23C 16/52* (2013.01)

(58) Field of Classification Search
CPC ... C23C 16/46; C23C 16/402; C23C 16/4583; C23C 16/52; C23C 16/44
See application file for complete search history.

(56) References Cited

U.S. PATENT DOCUMENTS 5,561,087 A    10/1996 Mikata
6,596,086 B1    7/2003 Honma et al.
(Continued)

FOREIGN PATENT DOCUMENTS

CN    1098329 A    2/1995
CN    1559079 A    12/2004
(Continued)

OTHER PUBLICATIONS

Machine translation, JP 2001-308085 (Year: 2001).*
International Search Report cited in PCT/CN2021/103642 mailed Oct. 25, 2021, 11 pages.

*Primary Examiner* — Michael G Miller
(74) *Attorney, Agent, or Firm* — Cooper Legal Group, LLC

(57) ABSTRACT

A film deposition method and a film deposition apparatus are provided. The film deposition method includes: putting a substrate into a furnace tube, the furnace tube including a first section for placing the substrate, the first section having an inlet for reaction gas; heating, within a first preset time, a first heating module from a first initial temperature to a first preset temperature, the first heating module surrounding the first section and being configured to heat the first section; maintaining, within a second preset time, the first heating module continuously at the first preset temperature; and within a third preset time, introducing the reaction gas into the furnace tube from the inlet, and heating the first heating module from the first preset temperature to a second preset temperature so as to form a target film on a surface of the substrate placed in the first section.

18 Claims, 4 Drawing Sheets

(51) Int. Cl.
  *C23C 16/458* (2006.01)
  *C23C 16/52* (2006.01)

(56) References Cited

U.S. PATENT DOCUMENTS

| | | | |
|---|---|---|---|
| 6,802,712 B2 | 10/2004 | Bernhardt et al. | |
| 2004/0157183 A1* | 8/2004 | Bernhardt | H01L 21/67109 |
| | | | 432/205 |

FOREIGN PATENT DOCUMENTS

| | | | | |
|---|---|---|---|---|
| CN | 109385623 A | | 2/2019 | |
| CN | 112941489 A | | 6/2021 | |
| JP | 2001308085 A | * | 11/2001 | ............ C23C 16/46 |
| JP | 2001308085 A | | 11/2001 | |

* cited by examiner

FILM DEPOSITION METHOD AND FILM DEPOSITION APPARATUS

CROSS-REFERENCE TO RELATED APPLICATIONS

The present application is a national stage of International Patent Application No. PCT/CN2021/103642, filed on Jun. 30, 2021, which claims the priority to Chinese Application No. 202110107889.3, titled "FILM DEPOSITION METHOD AND FILM DEPOSITION APPARATUS", filed on Jan. 27, 2021. The entire contents of International Patent Application No. PCT/CN2021/103642 and Chinese Application No. 202110107889.3 are incorporated herein by reference.

TECHNICAL FIELD

The present application relates to a film deposition method and a film deposition apparatus.

BACKGROUND

Film deposition is an essential part of the semiconductor manufacturing process. Traditional film deposition processes mainly include physical vapor deposition (PVD) and chemical vapor deposition (CVD). Wherein, CVD mainly generates a film on the surface of the substrate by chemical reactions of one or more gas-phase compounds or simple substances containing film elements.

SUMMARY

According to some embodiments, a first aspect of the present application provides a film deposition method. The film deposition method includes:
putting a substrate into a furnace tube, the furnace tube including a first section for placing the substrate, the first section having an inlet for reaction gas;
heating, within a first preset time, a first heating module from a first initial temperature to a first preset temperature, the first heating module surrounding the first section and being configured to heat the first section;
maintaining, within a second preset time, the first heating module continuously at the first preset temperature; and
within a third preset time, introducing the reaction gas into the furnace tube from the inlet, and heating the first heating module from the first preset temperature to a second preset temperature so as to form a target film on a surface of the substrate placed in the first section.

According to some embodiments, a second aspect of the present application further provides a film deposition apparatus configured to execute the film deposition method according to the first aspect. The film deposition apparatus includes:
a furnace tube, including a first section for placing a substrate, the first section having an inlet for reaction gas;
a first heating module, surrounding the first section and being configured to heat the first section;
a gas source, configured to supply reaction gas; and
a control module, electrically connected to the first heating module and the gas source, and configured to control the first heating module and the gas source;
wherein, under the control of the control module, within a first preset time, the first heating module is heated from a first initial temperature to a first preset temperature; within a second preset time, the first heating module is maintained continuously at the first preset temperature; within a third preset time, the reaction gas is introduced into the furnace tube from the inlet, and the first heating module is heated from the first preset temperature to a second preset temperature.

BRIEF DESCRIPTION OF THE DRAWINGS

In order to explain technical solutions of embodiments of the present application or in the prior art more clearly, the drawings to be used for describing the embodiments or the prior art will be introduced simply. Apparently, the drawings to be described below are merely some embodiments of the present application, and a person of ordinary skill in the art may further obtain other drawings according to these drawings without paying any creative effort.

DETAILED DESCRIPTION

Figure 1:
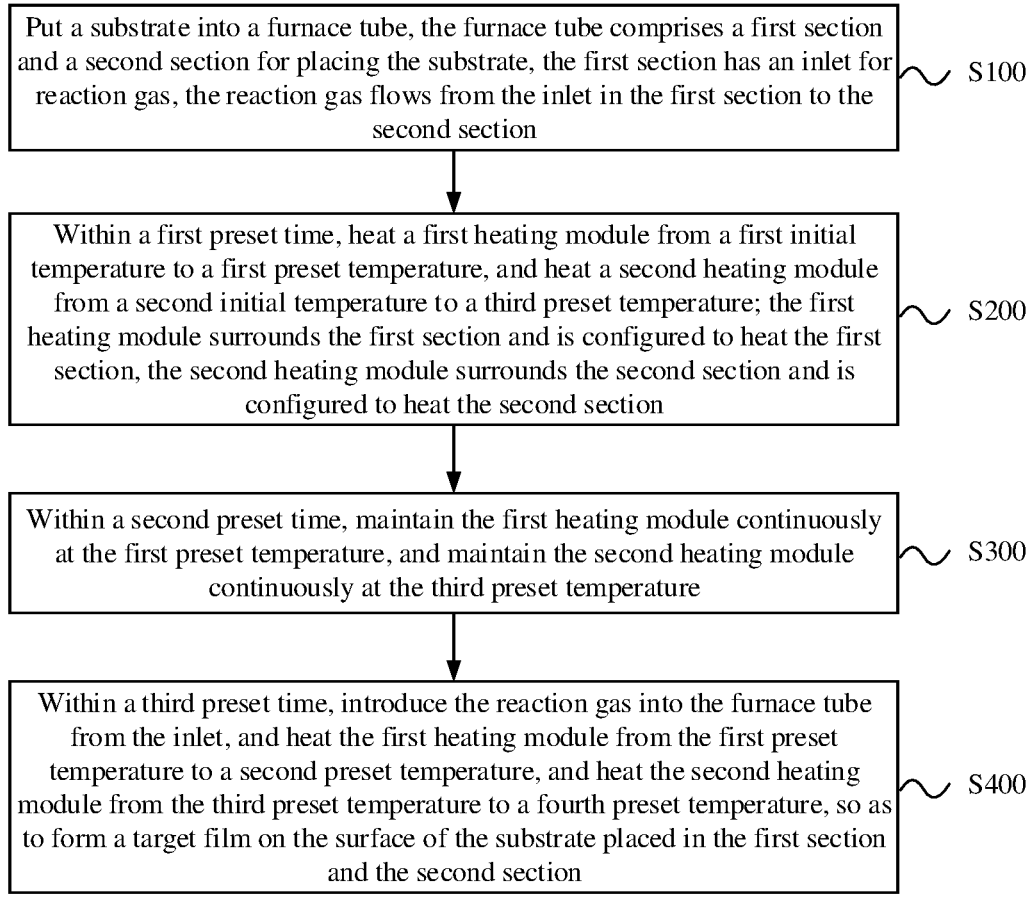
FIG. 1 is a flowchart of a film deposition method according to an embodiment of the present application.

In the process of some chemical vapor depositions (such as low pressure chemical vapor deposition (LPCVD)), the temperature of the low-temperature reaction gas will rise sharply in a short period of time, resulting in poor uniformity of the film deposited on the substrate.

In order to facilitate the understanding of the present application, the present application will be described more fully below with reference to the relevant drawings. Preferred embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meaning as commonly understood by a person of ordinary skill in the art to which the present application belongs. Here, terms used in the description of the present application are merely intended to describe specific embodiments, rather than limiting the present application.

It should be understood that, when an element or layer is referred to as being "located on", "adjacent to", "connected to" or "coupled to" other elements or layers, it may be located on, adjacent to, connected to, or coupled to other elements or layers directly or with intervening elements or layers therebetween. In contrast, when an element is referred to as being "directly located on", "directly adjacent to", "directly connected to" or "directly coupled to" other elements or layers, there are no intervening elements or layers therebetween. It should be understood that, although the terms first, second, third, etc., may be used to describe various elements, components, regions, layers, doping types and/or sections, these elements, components, regions, layers, doping types and/or sections should not be limited by these terms. These terms are only used to distinguish one element, component, region, layer, doping type or section from another element, component, region, layer, doping type or section. Therefore, without departing from the teachings of the present application, the first element, component, region, layer, doping type or section discussed below may be expressed as a second element, component, region, layer, doping type or section. For example, the first doping type may be expressed as the second doping type, and similarly, the second doping type may be expressed as the first doping type. The first doping type and the second doping type are different doping types. For example, the first doping type may be P-type and the second doping type may be N-type, or the first doping type may be N-type and the second doping type may be P-type.

Spatial relationship terms, such as "under", "below", "lower", "beneath", "above", "upper", etc., may be used here to describe the relationship between an element or feature shown in the drawings and other elements or features. It should be understood that, in addition to the orientations shown in the drawings, the spatial relationship terms are intended to include different orientations of devices in use and operation. For example, if a device in the drawings is turned over, then elements or features described as being "below" or "beneath" or "under" other elements will be oriented "on" the other elements or features. Therefore, the exemplary terms "below" and "under" may include both upward orientation and downward orientation. In addition, the device may be otherwise oriented (rotated by 90 degrees or in other orientations) and the spatial descriptions used here are interpreted accordingly.

As used herein, the singular forms of "a", "an" and "the" are intended to include plural forms, unless otherwise stated. It should be understood that the terms "including" and/or "including", when used in this specification, determine the existence of the described features, integers, steps, operations, elements and/or components, but do not exclude the existence or addition of one or more other features, integers, steps, operations, elements, components, and/or groups. Meanwhile, as used here, the term "and/or" includes any and all combinations of related listed items.

The embodiments of the present application will be described here with reference to cross-sectional views that are schematic diagrams of ideal embodiments (and intermediate structures) of the present invention, so that changes in the shape due to, for example, the manufacturing technology and/or tolerances may be expected. Therefore, the embodiments of the present application should not be limited to the specific shapes of the regions shown here, but include shape deviations due to, for example, the manufacturing technology. For example, an injection region shown as a rectangle usually has round or curved features and/or injection concentration gradients at its edges, rather than a binary change from an injection region to a non-injection region. Likewise, a buried region formed by the injection may result in some injection in regions between the buried region and a surface through which the injection proceeds. Therefore, regions shown in the drawings are schematic in nature, and their shapes are not intended to show the actual shape of the regions of the device and are not intended to limit the scope of the present application.

The film deposition method and the film deposition apparatus according to the present application may be used in, but not limited to, the LPCVD processes.

Figure 2:
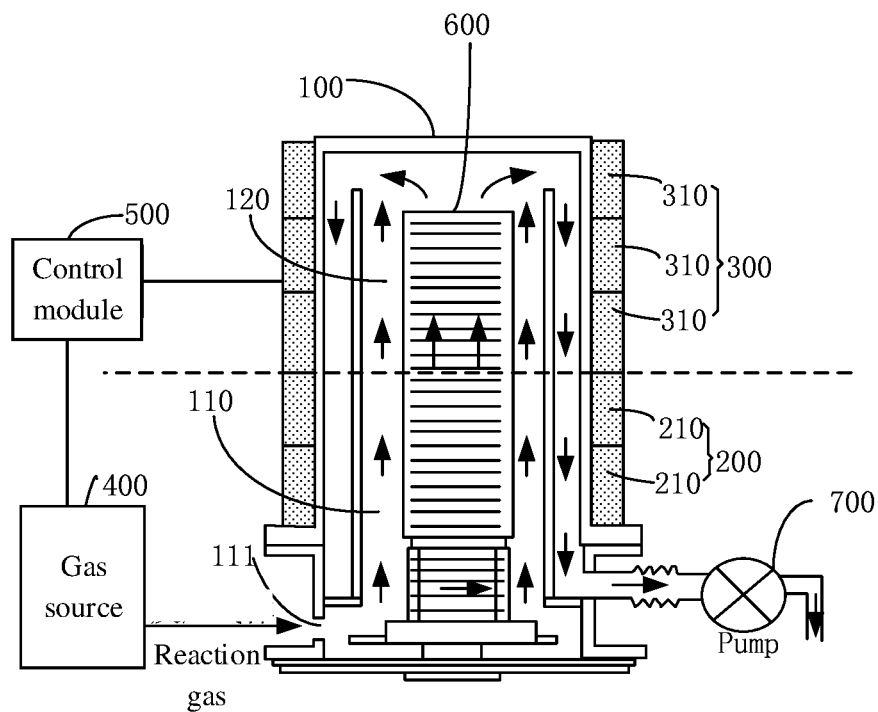
FIG. 2 is a schematic structure diagram of a film deposition apparatus according to an embodiment of the present application.
Figure 3:
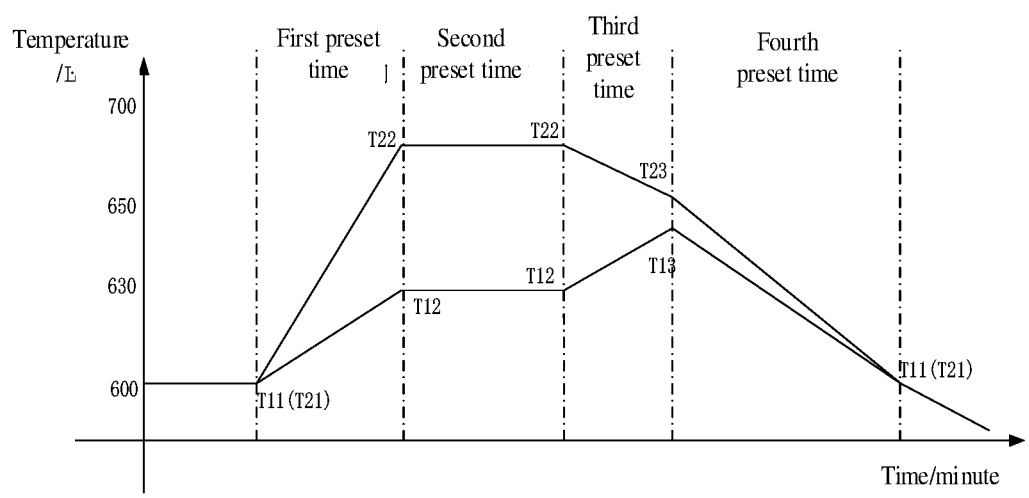
FIG. 3 is a schematic diagram of temperature control of a film deposition method according to an embodiment of the present application.

In one embodiment, referring to FIG. 1, FIG. 2 and FIG. 3, a film deposition method is provided, including following steps:

S100: putting a substrate into a furnace tube 100, the furnace tube 100 including a first section 110 for placing the substrate, the first section 110 having an inlet 111 for reaction gas;

S200: heating, within a first preset time, a first heating module 200 from a first initial temperature T11 to a first preset temperature T12, the first heating module 200 surrounding the first section 110 and being configured to heat the first section 110;

S300: maintaining, within a second preset time, the first heating module 200 continuously at the first preset temperature T12; and S400: within a third preset time, introducing the reaction gas into the furnace tube 100 from the inlet 111, and heating the first heating module 200 from the first preset temperature T12 to a second preset temperature T13 so as to form a target film on the surface of the substrate placed in the first section 110.

In S100, the substrate may be, but not limited to, a silicon wafer.

As an example, first, a substrate in a substrate box may be grabbed onto the cassette. That is, the substrate is loaded on the cassette. Then, the cassette is delivered into the furnace tube 100.

The furnace tube 100 includes a first section 110 for placing a substrate. That is, after the substrate is placed in the furnace tube 100, the first section 110 of the furnace tube 100 has the substrate therein.

The first section 110 has an inlet 111 for reaction gas. That is, the first section 110 is a gas intake section. In the subsequent S400, the reaction gas enters the furnace tube 100 from the inlet 111.

The reaction gas is one or more gas-phase compounds or simple substances containing target film elements.

As an example, the target film may be a silicon dioxide ($SiO_2$) film. Then, the reaction gas may be tetraethyl orthosilicate (TEOS) gas. The thermal decomposition equation for TEOS is:

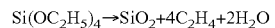

In S200, within a first preset time, the first heating module 200 is heated from a first initial temperature T11 to a first preset temperature T12. The first section 110 of the furnace tube 100 is heated by the first heating module 200. The first heating module 200 surrounds the first section 110 and conducts its heat to the first section 110 of the furnace tube 100 to provide process temperature conditions for it.

Specifically, the first heating module 200 may include a plurality of first heating units 210. For example, the first heating module 200 includes two first heating units 210 in FIG. 2. Of course, it may include only one first heating unit 210. The number of first heating units is specifically set according to actual needs.

The first initial temperature T11 is the temperature of the first heating module 200 heating the first section 110 before the first preset time. In order to improve efficiency, the first initial temperature T11 may not be room temperature, but a certain temperature higher than room temperature and close to the reaction temperature. In this case, the first heating module 200 may be pre-heated to maintain it at the first initial temperature T11 after reaching the first initial temperature T11, and then stand by.

As an example, when the reaction gas is TEOS gas and the target film is $SiO_2$ film, the first initial temperature T11 may be set to 600° C. (as shown in FIG. 3).

Of course, the present application is not limited thereto, and the first initial temperature T11 may be room temperature or other temperatures.

The first preset temperature T12 is a preset temperature to be reached by the first heating module 200 before heating the first heating module 200 from the first initial temperature T11.

In S300, by controlling the heating power, the first heating module 200 may be maintained continuously at the first preset temperature T12.

Since the first heating module 200 conducts its heat to the first section 110 of the furnace tube 100, the substrate in the first section 110 of the furnace tube 100 reaches the process temperature. The process temperature required for heat conduction to bring the substrate to the temperature takes a certain period of time. Therefore, when the first heating module 200 just reaches the first preset temperature T12, the temperature of the substrate placed in the first section 110 actually does not reach the set first preset temperature T12.

Therefore, in the present application, maintaining the first heating module 200 continuously at the first preset temperature T12 within the second preset time can ensure the actual temperature of the substrate placed in the first section 110 of the furnace tube 100 to reach the stable first preset temperature T12 after a period of heat conduction.

In S400, the reaction gas is introduced, and the process enters the film formation stage by deposition.

The reaction gas is introduced into the furnace tube 100 by the inlet 111, and the inlet 111 is located in the first section 110. Meanwhile, before S400, the substrate placed in the first section 110 has been at the uniform first preset temperature T12 because of being continuously heated for the second preset time.

Therefore, in S400, when the low-temperature reaction gas is introduced into the furnace tube 100 from the inlet 111 in the first section 110, the temperature of the edge of the substrate in the first section 110 will be reduced, thereby affecting the quality of film formation on the substrate at that position.

Therefore, here, while the reaction gas is introduced into the furnace tube 100 from the inlet 111, the first heating module 200 is heated from the first preset temperature T12 to the second preset temperature T13. During the heating process, the edge of the substrate has a higher heating rate than the center because it is close to the first heating module 200.

Therefore, in this embodiment, the temperature of the edge and the center of the substrate can be affected by the difference in the heating rate during the heating process, and the difference between the edge temperature and the center temperature of the substrate caused by the low-temperature reaction gas can be balanced, so that a film of uniform quality can be formed on the substrate in the first section.

It may be understood that the quality of film formation includes the comprehensive quality, such as crystallinity, compactness, and thickness of the film layer, etc.

Here, the film thickness is taken as an example to illustrate the influence of the method in this embodiment on the film quality.

Figure 4A:
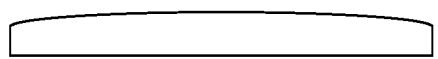
FIG. 4a is a characteristic diagram of the target film formed on the substrate placed in the first section when it is affected by the introduction of low-temperature reaction gas.

Specifically, since the low-temperature reaction gas is introduced by the inlet 111 in the first section 110, the introduced low-temperature reaction gas will diffuse from the edge of the substrate to the center of the substrate, thus causing the edge temperature of the substrate placed in the first section 110 lower than the center temperature. The higher the temperature is, the faster the film deposition rate is. Therefore, referring to FIG. 4a, the target film deposited on the substrate in the early stage of deposition will be thick at the center and thin at the edge.

Therefore, here, within the third preset time, while introducing the reaction gas into the furnace tube from the inlet, the first heating module is heated from the first preset temperature T12 to the second preset temperature T13 so as to form a target film on the surface of the substrate placed in the first section 110.

Figure 4B:
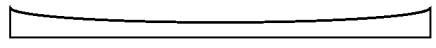
FIG. 4b is a characteristic diagram of the target film formed on the substrate placed in the first section when it is affected by the heating.

The first heating module 200 is heated from the first preset temperature to the second preset temperature, and the temperature at the edge of the substrate rises faster because it is close to the first heating module 200. The temperature in the center of the substrate rises slower because it is far away from the first heating module 200. Therefore, the temperature at the edge of the substrate is gradually higher than the temperature at the center. The higher the temperature is, the higher the deposition rate is. Therefore, the target film deposited will be thin at the center and thick at the edge, referring to FIG. 4b.

Figure 4C:
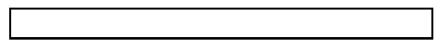
FIG. 4c is a characteristic diagram of the target film formed on the substrate in the first section according to an embodiment of the present application.

Therefore, in the present application, the film layer in the first section has a lower edge temperature and a higher center temperature during the process of starting the introduction of the reaction gas, and the target film deposited on the substrate will be thick at the center and thin at the edge; while the reaction gas is introduced, the first heating module 200 is heated from the first preset temperature T12 to the second preset temperature T13, the temperature at the edge of the substrate rises faster, and the temperature in the center of the substrate rises slower. Therefore, in the later stage of the deposition, the temperature at the edge of the substrate is gradually higher than the temperature at the center, so that the target film deposited on the substrate will be thin at the center and thick at the edge. This is complementary to the fact that the target film is thick at the center and thin at the edge, which is caused by the introduction of low-temperature reaction gas. The finally formed target film has better uniformity. That is, in the present application, by heating, the influence of the heating rate and the influence of the introduction of low-temperature reaction gas are balanced, thereby forming a target film with uniform thickness on the substrate, referring to FIG. 4c.

Figure 5A:
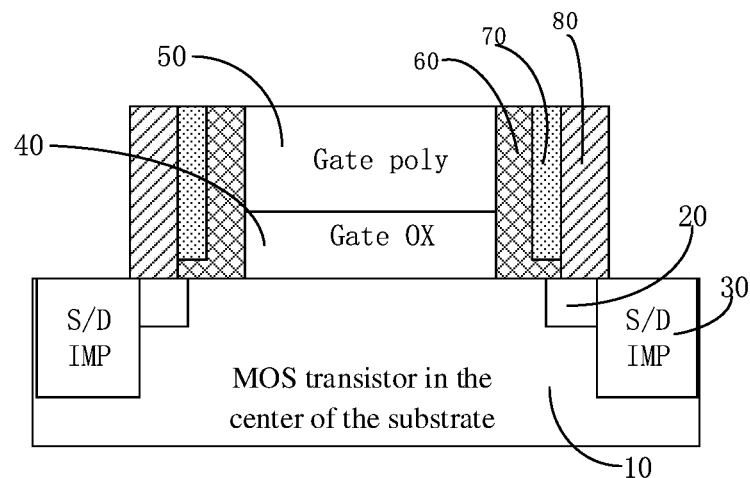
FIG. 5a is a characteristic diagram of the target film on the substrate placed in the first section, which is formed by the MOS transistor at the center and the MOS transistor at the edge, when it is affected by the introduction of low-temperature reaction gas.
Figure 5A:
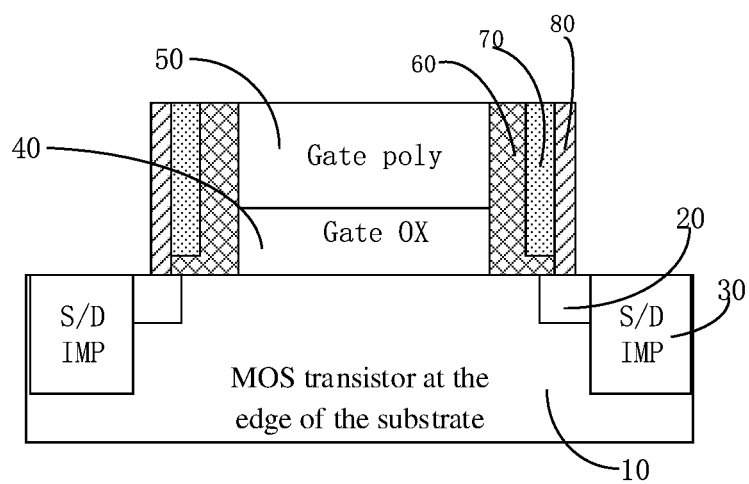
Figure 5B:
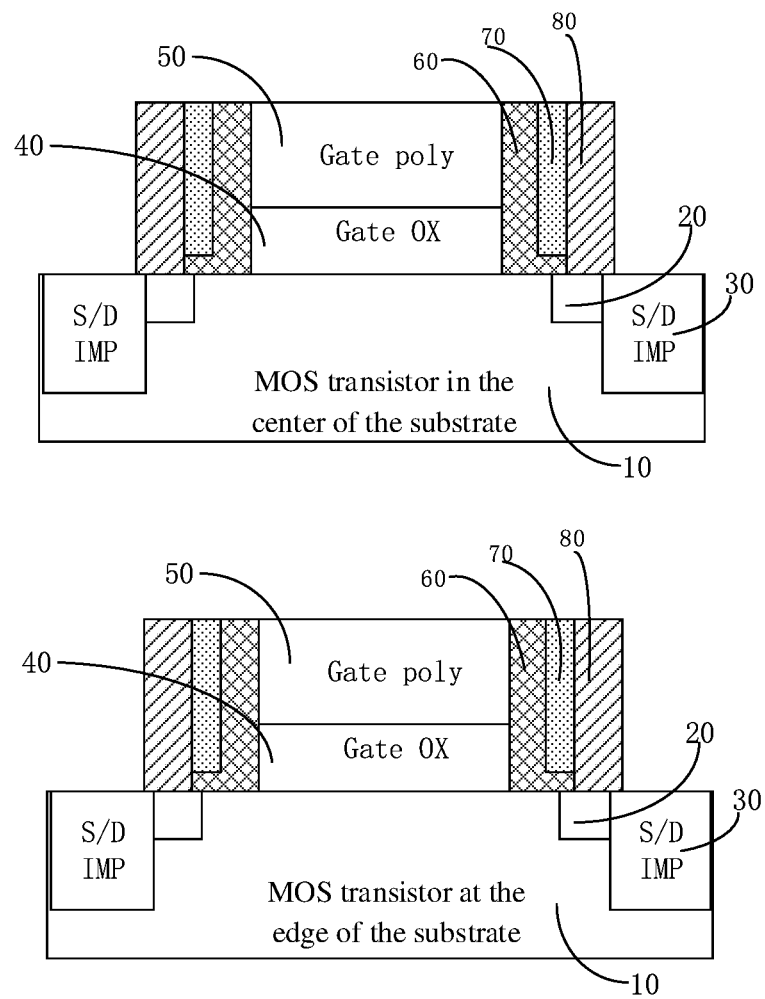
FIG. 5b is a characteristic diagram of the target film on the substrate placed in the first section according to an embodiment of the present application, which is formed by the MOS transistor at the center and the MOS transistor at the edge.

More specifically, this embodiment may be applied to the MOS transistor manufacturing process. Referring to FIG. 5a and FIG. 5b, the MOS transistor may include an underlayer 10, a shallow doped region 20, a source and drain region 30, a gate oxide layer 40, a gate 50, an isolating layer 60, a first dielectric layer 70, and a second dielectric layer 80. The second dielectric layer 80 may be a $SiO_2$ film formed by LPCVD with TEOS gas, which may be used as the target film in this embodiment. The underlayer 10, on which the shallow doped regions 20, the source and drain region 30, the gate oxide layer 40, the gate 50, the isolating layer 60 and the first dielectric layer 70 are formed, may be defined as the substrate.

Referring to FIG. 5a, then, the low-temperature reaction gas is introduced from the inlet 111 in the first section 110. Therefore, affected by the low-temperature reaction gas, the thickness of the $SiO_2$ film on the MOS transistor device located in the center of the substrate will be greater than the thickness of the $SiO_2$ film on the MOS transistor device located at the edge of the substrate.

Referring to FIG. 5b, since, in the present application, the first heating module 200 heating the first section 110 is heated (from the first preset temperature T12 to the second preset temperature T13), the edge temperature of the substrate may be gradually higher than the center temperature, so that the thickness of the $SiO_2$ film on the MOS transistor device located in the center of the substrate is finally uniform with the thickness of the $SiO_2$ film on the MOS transistor device located at the edge of the substrate.

Meanwhile, it may be understood that the first initial temperature T11, the first preset temperature T12, the duration of the first preset time, the duration of the second preset time, and the duration of the third preset time may be set according to actual needs.

In one embodiment, referring to FIG. 2, the furnace tube 100 further includes a second section 120 for placing a substrate. The reaction gas flows from the inlet 111 in the first section 110 to the second section 120.

In this case, first, the substrate in the furnace tube 100 may be loaded on the cassette, so that the cassette is filled with substrates and then extends from the first section 110 to the second section 120.

As an example, the first section 110 may be located at the lower part of the furnace tube 100, the second section 120 may be located at the upper part of the furnace tube, and the inlet 111 may be located at the lower part of the first section 110.

Of course, the arrangement of the furnace tube 100 is not limited thereto. For example, it may be possible that the first section 110 may be located at the center of the furnace tube 100, and the second section 110 may be located at both ends of the furnace tube 100; and so on.

Referring to FIG. 2 and FIG. 3, in this embodiment, within the first preset time, the second heating module 300 will be heated from the second initial temperature T21 to the third preset temperature T22. The second heating module 300 surrounds the second section 120 and is configured to heat the second section 120.

Specifically, the second heating module 300 may include a plurality of second heating units 310. For example, the second heating module 300 includes three second heating units 310 in FIG. 2. Of course, it may include only one second heating unit 310. The number of second heating units is specifically set according to actual needs.

The second initial temperature T21 is the temperature of the second heating module 300 heating the second section 120 before the first preset time.

In order to improve efficiency, the second initial temperature T21 may not be room temperature, but a certain temperature higher than room temperature and close to the reaction temperature. In this case, the second heating module 300 may be pre-heated to maintain it at the second initial temperature T21 after reaching the second initial temperature T21, and then stand by.

As an example, when the reaction gas is TEOS gas and the target film is $SiO_2$ film, the second initial temperature T21 may be set to 600° C.

Of course, the present application is not limited thereto, and the second initial temperature T21 may be room temperature or other temperatures.

Moreover, in this embodiment, within the first preset time, the second heating module 300 is heated from the second initial temperature T21 to the third preset temperature T22, and meanwhile, within the second preset time, the second heating module 300 is maintained continuously at the third preset temperature T22.

By controlling the heating power, the second heating module 300 may be maintained continuously at the third preset temperature T22.

Since the second heating module 300 conducts its heat to the second section 120 of the furnace tube 100, the substrate in the second section 120 of the furnace tube 100 reaches the process temperature. The process temperature required for heat conduction to bring the substrate to the temperature takes a certain period of time. Therefore, when the second heating module 300 just reaches the third preset temperature T22, the temperature of the substrate placed in the second section 120 actually does not reach the set third preset temperature T22.

Therefore, in the present application, maintaining the second heating module 300 continuously at the third preset temperature T22 within the second preset time can ensure the actual temperature of the substrate placed in the second section 120 of the furnace tube 100 to reach the stable third preset temperature T22 after a period of heat conduction.

Moreover, in this embodiment, within the third preset time, the second heating module 300 is cooled from the third preset temperature T22 to the fourth preset temperature T23 so as to form the target film on the surface of the substrate placed in the second section.

As an example, the heating rate of the first heating module 200 from the first preset temperature T12 to the second preset temperature T13 may be 2° C. to 15° C., and the cooling rate of the second heating module 300 from the third preset temperature T22 to the fourth preset temperature T23 may be 1° C. to 10° C.

Since the reaction gas flows from the inlet 111 in the first section 110 to the second section 120, the reaction gas is rapidly heated during the flow. Therefore, the edge of the substrate placed in the second section has basically the same temperature as the center.

Figure 6A:
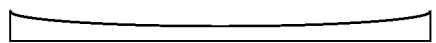
FIG. 6a is a characteristic diagram of the target film formed on the substrate placed in the first section when it is affected by the concentration of the reaction gas.

However, since the gas diffuses from the edge of the substrate to the center, the concentration of the reaction gas at the edge of the substrate is greater than the concentration of the reaction gas at the center. The higher the reaction gas concentration is, the higher the film deposition rate is. Therefore, referring to FIG. 6a, the target film deposited on the substrate will be thin at the center and thick at the edge.

Therefore, here, within the third preset time, while introducing the reaction gas into the furnace tube from the inlet, the second heating module is cooled from the third preset temperature T22 to the fourth preset temperature T23 so as to form a target film on the surface of the substrate placed in the second section 120.

Figure 6B:
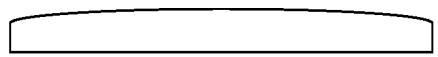
FIG. 6b is a characteristic diagram of the target film formed on the substrate placed in the second section when it is affected by the heating.

The temperature also affects the deposition rate. The second heating module 300 is cooled from the third preset temperature to the fourth preset temperature, and the temperature at the edge of the substrate drops faster because it is close to the second heating module 300. The temperature in the center of the substrate drops slower because it is far away from the second heating module 300. Therefore, the temperature in the center of the substrate is gradually higher than the temperature at the edge. The higher the temperature is, the higher the deposition rate is. Therefore, the target film deposited will be thick at the center and thin at the edge, referring to FIG. 6b.

Figure 6C:
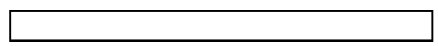
FIG. 6c is a characteristic diagram of the target film formed on the substrate in the second section according to an embodiment of the present application.

Therefore, in the present application, the film layer in the second section has a higher reaction gas concentration at the edge and a lower reaction gas concentration at the center during the process of starting the introduction of the reaction gas, and the target film deposited on the substrate will be thin at the center and thick at the edge; while the reaction gas is introduced, the second heating module 300 is cooled from the third preset temperature T22 to the fourth preset temperature T23, the temperature at the edge of the substrate drops faster, and the temperature in the center of the substrate drops slower. Therefore, in the later stage of the deposition, the temperature in the center of the substrate is gradually higher than the temperature at the edge, so that the target film deposited on the substrate will be thick at the center and thin at the edge. This is complementary to the fact that the target film is thin at the center and thick at the edge, which is caused by the reaction gas concentration. The finally formed target film has better uniformity. That is, in the present application, by cooling, the influence of the temperature on the film layer deposition rate and the influence of the reaction gas concentration on the film layer deposition rate are balanced, thereby forming a target film with uniform thickness on the substrate, referring to FIG. 6c.

In one embodiment, the third preset temperature T22 is higher than the first preset temperature T12.

In the furnace tube 100, since the reaction gas flows from the first section 110 to the second section 120, the concentration of the reaction gas in the first section may be higher than the concentration of the reaction gas in the second section. Consequently, the thickness of the target film formed in the second section 120 may be less than the thickness of the target film formed in the first section 110.

In this embodiment, the third preset temperature T22 of the second heating module 300 is set to be higher than the first preset temperature T12 of the first heating module 200, so that the influence of the temperature can balance the influence of the reaction gas concentration. Therefore, the thickness of the target film formed in the first section 110 and the second section 120 may be uniform.

As an example, the first preset temperature T12 may be the lowest temperature required for film formation, and the third preset temperature T22 may be the highest temperature required for film formation.

When the reaction gas is TEOS gas and the target film is $SiO_2$ film, the first preset temperature T12 may be set to 630° C., and the third preset temperature T22 may be set to 660° C.

In one embodiment, on the basis of the foregoing embodiments, the first initial temperature T11 is set to be the same as the second initial temperature T21.

The first section 110 heated by the first heating module 200 and the second section 120 heated by the second heating module 300 are different connected parts in the same furnace tube 100. Therefore, setting the first initial temperature T11 and the second initial temperature T12 to be the same can ensure that the first section and the second section have a relatively accurate temperature at the beginning of the first preset time, thereby facilitating temperature setting.

Meanwhile, in this embodiment, within the first preset time, the heating rate of the first heating module 200 is less than the heating rate of the second heating module 300, so that the third preset temperature T22 is higher than the first preset temperature T12.

Of course, in the present application, the first initial temperature T11 is not limited to the same as the second initial temperature T21. Also, the third preset temperature T22 is not limited to being higher than the first preset temperature T12.

For example, the third preset temperature T22 may be set to be equal to or lower than the first preset temperature T12. In this case, the second preset temperature T13 may be set as the highest temperature required for film formation, and the fourth preset temperature T23 may be set as the lowest temperature required for film formation.

In one embodiment, within the third preset time, the heating increase process of the first heating module 200 and the cooling process of the second heating module 300 are performed synchronously.

In this case, the temperature at the first section 110 heated by the first heating module 200 and the temperature at the second section 120 heated by the second heating module 300 can be effectively prevented from interfering with each other.

Of course, the heating process of the first heating module 200 and the cooling process of the second heating module 300 may be performed asynchronously.

In one embodiment, the film deposition method further includes:

In S500, within the fourth preset time, the first heating module 200 is cooled from the second preset temperature T13 to the first initial temperature T11.

At the same time, when the furnace tube 100 further includes the second section 120 for placing the substrate, within the fourth preset time, the second heating module 300 is also cooled from the fourth preset temperature T23 to the second initial temperature T21.

Specifically, the first heating module 200 and the second heating module 300 may be cooled by natural cooling.

In this case, it can facilitate subsequent operations. The subsequent operation may be, for example, film formation on the substrates of next batch.

Or, further, the first preset time, the second preset time, the third preset time, and the fourth preset time form a growth cycle.

The film deposition method includes: repeating a plurality of growth cycles to form a target film with a preset thickness. That is, a plurality of growth cycles may be repeated among S100, S200, S300, S400, and S500 to form a target film with a preset thickness.

The "plurality" here includes two and more than two. "Preset thickness" is the target thickness that the target film needs to reach.

In addition, in the embodiment of the present application, the film deposition method may further include:

S600: taking the substrate out from the furnace tube 100, and then cooling the substrate.

Specifically, as described above, the substrate may be placed in the cassette. After the target film with the target thickness is deposited, and after S500, the cassette carrying the substrate may be pulled out from the furnace tube to cool the substrate continuously. When the temperature drops to a temperature that the substrate can be grabbed, the wafer is grabbed from the cassette to the wafer box.

It should be understood that although the steps in the flowchart shown in FIG. 1 are sequentially displayed by following the arrows, these steps are not necessarily performed in the order indicated by the arrows. Unless explicitly stated herein, the execution order of these steps is not strictly limited, and they may be performed in other orders. Moreover, at least some of the steps in FIG. 1 may include multiple sub-steps or multiple stages. These sub-steps or stages are not necessarily performed at the same moment of time, and instead, may be performed at different moments of time. The sub-steps or stages are not necessarily performed sequentially, and instead, may be performed in turn or alternately with other steps or at least some of the sub-steps or stages of other steps.

In one embodiment, referring to FIG. 2, a film deposition apparatus is also provided to execute the film deposition method. The film deposition apparatus includes a furnace tube 100, a first heating module 200, a gas source 400 and a control module 500.

The furnace tube 100 includes a first section 110 for placing a substrate, the first section 110 having an inlet for reaction gas. The first heating module 200 surrounds the first section 110 for heating the first section 110. The gas source 400 is used to supply reaction gas.

The control module 500 is electrically connected to the first heating module 200 and the gas source 400, to control the first heating module 200 and the gas source 400.

Specifically, under the control of the control module 500:

within the first preset time, the first heating module 200 is heated from the first initial temperature T11 to the first preset temperature T12; within the second preset time, the first heating module 200 is maintained continuously at the first preset temperature T12; and within the third preset time, the reaction gas is introduced into the furnace tube 100 from the inlet 111, and the first heating module 200 is heated from the first preset temperature T12 to the second preset temperature T13.

In this embodiment, the first heating module 200 can be controlled to be heated from the first preset temperature T12 to the second preset temperature T13 within the third preset time. The temperature of the edge and the center of the substrate can be affected by the difference in the heating rate during the heating process, and the difference between the edge temperature and the center temperature of the substrate caused by the low-temperature reaction gas can be balanced, so that a film of uniform quality can be formed on the substrate in the first section.

In one embodiment, the furnace tube 100 further includes a second section 120 for placing the substrate. The film deposition apparatus further includes a second heating module 300. The second heating module 300 surrounds the second section 120 and is configured to heat the second section 120.

The control module 500 is electrically connected to the second heating module 300 to control the second heating module 300.

Under the control of the control module 500:

within the first preset time, the second heating module 300 is heated from the second initial temperature T21 to the third preset temperature T22; within the second preset time, the second heating module 300 is maintained continuously at the third preset temperature T22; and within the third preset time, the second heating module 300 is cooled from the third preset temperature T22 to the fourth preset temperature T23.

In this embodiment, while the reaction gas is introduced into the furnace tube from the inlet, the second heating module is cooled from the third preset temperature to the fourth preset temperature. During the cooling process, the edge of the substrate has a higher cooling rate than the center because it is close to the second heating module. Therefore, in this embodiment, by the difference in the cooling rate at the edge and center of the substrate during the cooling process, the temperature at the edge of the substrate can be gradually lower than the temperature at the center, thereby balancing the influence, on the film thickness, of the fact that the reaction gas concentration at the edge of the substrate is greater than the reaction gas concentration at the center. Therefore, the thickness of the target film formed on the substrate in the second section is uniform.

In one embodiment, the first section 110 is located at the lower part of the furnace tube 100, the second section 120 is located at the upper part of the furnace tube 100, and the inlet 111 is located at the lower part of the first section 110.

In one embodiment, the film deposition apparatus further includes a cassette 600. The substrate in the furnace tube 100 is loaded on the cassette 600. The cassette 600 is filled with substrates and extends from the first section 110 to the second section 120.

In addition, the film deposition apparatus may further include a vacuum pump 700 for pumping air out from the furnace tube 100 before the reaction gas is introduced. Meanwhile, during the gas reaction process, the vacuum pump 700 pumps out the gas while introducing the reaction gas from the inlet. This can maintain the pressure in the furnace tube constant. In addition, by the vacuum pump 700, the reaction gas can be circulated and evenly distributed.

For the specific definition of the film deposition apparatus, please refer to the above definition of the film deposition method, which will not be repeated here. The control module in the film deposition apparatus may be implemented fully or partially by software, hardware and a combination thereof. The control module may be embedded in or independent of the processor in a computer device in the form of hardware, or may be stored in the memory of the computer device in the form of software, so that the processor can call and execute the operations corresponding to the above modules.

Various technical features of the above embodiments may be arbitrarily combined. For simplicity, all possible combinations of various technical features of the above embodiments are not described. However, all those technical features shall be included in the protection scope of the present invention if not conflict.

The embodiments described above merely represent certain implementations of the present application. Although those embodiments are described in more specific details, it is not to be construed as any limitation to the scope of the present application. It should be noted that, for a person of ordinary skill in the art, a number of variations and improvements may be made without departing from the concept of the present application, and those variations and improvements should be regarded as falling into the protection scope of the present application. Therefore, the protection scope of the present application should be subject to the appended claims.

The invention claimed is:

1. A film deposition method, comprising:
putting a substrate into a furnace tube, the furnace tube comprising a first section for placing the substrate, the first section having an inlet for reaction gas;
heating, within a first preset time, a first heating module from a first initial temperature to a first preset temperature, the first heating module surrounding the first section and being configured to heat the first section;

maintaining, within a second preset time, the first heating module continuously at the first preset temperature to heat the substrate, so that a temperature of the substrate reaches the first preset temperature; and within a third preset time, introducing the reaction gas into the furnace tube from the inlet, and heating the first heating module from the first preset temperature to a second preset temperature so as to form a target film on a surface of the substrate placed in the first section by deposition; wherein in an early stage of the deposition, the introducing the reaction gas into the furnace tube from the inlet causes a temperature of an edge of the substrate to be lower than a temperature of a center of the substrate and the target film deposited in the early stage to be thinner at the edge of the substrate than at the center of the substrate;

in a later stage of the deposition, the heating the first heating module from the first preset temperature to a second preset temperature causes the temperature of the edge of the substrate to be higher than the temperature of the center of the substrate and the target film deposited in the later stage to be thicker at the edge of the substrate than at the center of the substrate; and the target film deposited in the early stage being thinner at the edge of the substrate than at the center of the substrate is complementary to the target film deposited in the later stage being thicker at the edge of the substrate than at the center of the substrate so as to form the target film with a uniform thickness on the substrate.

2. The film deposition method according to claim 1, wherein the furnace tube further comprises a second section for placing a second substrate, and the reaction gas flows from the inlet in the first section to the second section; and the film deposition method further comprises:

heating, within the first preset time, a second heating module from a second initial temperature to a third preset temperature, the second heating module surrounding the second section and being configured to heat the second section;

maintaining, within the second preset time, the second heating module continuously at the third preset temperature; and within the third preset time, cooling the second heating module from the third preset temperature to a fourth preset temperature so as to form a second target film on a surface of the second substrate placed in the second section.

3. The film deposition method according to claim 2, wherein the third preset temperature is higher than the first preset temperature.

4. The film deposition method according to claim 3, wherein the first preset temperature is a lowest temperature required for film formation, and the third preset temperature is a highest temperature required for film formation.

5. The film deposition method according to claim 3, wherein the first initial temperature is the same as the second initial temperature, and a heating rate of the first heating module is less than a heating rate of the second heating module within the first preset time.

6. The film deposition method according to claim 2, wherein the first section is located at a lower part of the furnace tube, the second section is located at an upper part of the furnace tube, and the inlet is located at a lower part of the first section.

7. The film deposition method according to claim 6, wherein the substrate and the second substrate in the furnace tube are loaded on a cassette, and the cassette is filled with at least the substrate and the second substrate and extends from the first section to the second section.

8. The film deposition method according to claim 2, wherein, within the third preset time, a heating process of the first heating module and a cooling process of the second heating module are synchronously performed.

9. The film deposition method according to claim 2, wherein a heating rate of the first heating module from the first preset temperature to the second preset temperature is 2° C. to 15° C., and a cooling rate of the second heating module from the third preset temperature to the fourth preset temperature is 1° C. to 10° C.

10. The film deposition method according to claim 2, further comprising:

within a fourth preset time, cooling the first heating module from the second preset temperature to the first initial temperature, and cooling the second heating module from the fourth preset temperature to the second initial temperature.

11. The film deposition method according to claim 10, wherein the first preset time, the second preset time, the third preset time, and the fourth preset time form a growth cycle, and the film deposition method further comprises:

repeating a plurality of growth cycles to form a target film with a preset thickness.

12. The film deposition method according to claim 1, wherein the target film comprises a silicon dioxide film and the reaction gas comprises tetraethyl orthosilicate.

13. The film deposition method according to claim 1, further comprising:

taking the substrate out from the furnace tube, and then cooling the substrate.

14. A film deposition apparatus, configured to execute a film deposition method, and comprising:

a furnace tube, comprising a first section for placing a substrate, the first section having an inlet for reaction gas;

a first heating module, surrounding the first section and being configured to heat the first section;

a gas source, configured to supply the reaction gas; and a control module, electrically connected to the first heating module and the gas source, and configured to control the first heating module and the gas source; wherein, under a control of the control module, within a first preset time, the first heating module is heated from a first initial temperature to a first preset temperature; within a second preset time, the first heating module is maintained continuously at the first preset temperature to heat the substrate, so that a temperature of the substrate reaches the first preset temperature; within a third preset time, the reaction gas is introduced into the furnace tube from the inlet, and the first heating module is heated from the first preset temperature to a second preset temperature so as to form a target film on a surface of the substrate placed in the first section by deposition; wherein in an early stage of the deposition, introducing the reaction gas into the furnace tube from the inlet causes a temperature of an edge of the substrate to be lower than a temperature of a center of the substrate and the target film deposited in the early stage to be thinner at the edge of the substrate than at the center of the substrate;

in a later stage of the deposition, heating the first heating module from the first preset temperature to the second preset temperature causes the temperature of the edge of the substrate to be higher than the temperature of the center of the substrate and the target film deposited in the later stage to be thicker at the edge of the substrate than at the center of the substrate;

the target film deposited in the early stage being thinner at the edge of the substrate than at the center of the substrate is complementary to the target film deposited in the later stage being thicker at the edge of the substrate than at the center of the substrate so as to form the target film with a uniform thickness on the substrate; and the film deposition method comprises:
putting the substrate into the furnace tube;
heating, within the first preset time, the first heating module from the first initial temperature to the first preset temperature;
maintaining, within the second preset time, the first heating module continuously at the first preset temperature; and
within the third preset time, introducing the reaction gas into the furnace tube from the inlet, and heating the first heating module from the first preset temperature to the second preset temperature.

15. The film deposition apparatus according to claim 14, wherein the furnace tube further comprises a second section for placing a second substrate, and the film deposition apparatus further comprises a second heating module, the second heating module surrounds the second section and is configured to heat the second section; and the control module is electrically connected to the second heating module, and configured to control the second heating module; under the control of the control module, within the first preset time, the second heating module is heated from a second initial temperature to a third preset temperature; within the second preset time, the second heating module is maintained continuously at the third preset temperature; within the third preset time, the second heating module is cooled from the third preset temperature to a fourth preset temperature.

16. The film deposition apparatus according to claim 15, wherein the first section is located at a lower part of the furnace tube, the second section is located at an upper part of the furnace tube, and the inlet is located at a lower part of the first section.

17. The film deposition apparatus according to claim 16, wherein the film deposition apparatus further comprises a cassette, the substrate and the second substrate in the furnace tube are loaded on the cassette, and the cassette is filled with at least the substrate and the second substrate and extends from the first section to the second section.

18. The film deposition apparatus according to claim 16, further comprising:
a vacuum pump, configured to pump air out from the furnace tube before the reaction gas is introduced.

* * * * *